(12) United States Patent
Lin et al.

(10) Patent No.: US 9,978,604 B2
(45) Date of Patent: May 22, 2018

(54) SALICIDE FORMATION USING A CAP LAYER

(71) Applicant: TAIWAN SEMICONDUCTOR MANUFACTURING COMPANY, LTD., Hsinchu (TW)

(72) Inventors: Mei-Hsuan Lin, Tainan (TW); Chih-Hsun Lin, Tainan (TW); Ching-Hua Chu, Kaohsiung (TW); Ling-Sung Wang, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days. days.

(21) Appl. No.: 14/957,948

(22) Filed: Dec. 3, 2015

(65) Prior Publication Data

US 2016/0093497 A1    Mar. 31, 2016

Related U.S. Application Data

(63) Continuation of application No. 13/367,989, filed on Feb. 7, 2012, now Pat. No. 9,343,318.

(51) Int. Cl.
*H01L 21/28* (2006.01)
*H01L 21/285* (2006.01)
(Continued)

(52) U.S. Cl.
CPC .. *H01L 21/28518* (2013.01); *H01L 21/02381* (2013.01); *H01L 21/02425* (2013.01); *H01L 21/02532* (2013.01); *H01L 21/02617* (2013.01); *H01L 21/28052* (2013.01); *H01L 21/28568* (2013.01); *H01L 29/41783* (2013.01);
(Continued)

(58) Field of Classification Search
CPC ......... H01L 21/28052; H01L 21/28518; H01L 29/4975; H01L 29/7845; H01L 21/28537; H01L 21/32051; H01L 21/32053; H01L 21/76889; H01L 21/823418; H01L 21/823814; H01L 21/823835; H01L 29/665–29/66507
See application file for complete search history.

(56) References Cited

U.S. PATENT DOCUMENTS

6,518,625 B1    2/2003  Nishida et al.
2005/0037558 A1 2/2005  Gong et al.
(Continued)

*Primary Examiner* — Kevin Parendo
(74) *Attorney, Agent, or Firm* — Hauptman Ham, LLP (57) ABSTRACT

A method of forming a semiconductor device includes forming a gate stack over a first portion of a source and a first portion of a drain. The method includes depositing a first cap layer comprising silicon over a second portion of the source and depositing a second cap layer comprising silicon over a second portion of the drain. The method includes depositing a metal layer over the gate stack, the first cap layer and the second cap layer. The method includes annealing the semiconductor device until all of the silicon in the first and second cap layers reacts with metal from the metal layer, wherein the annealing causes metal from the metal layer to react with silicon in the first cap layer, the second cap layer, the source, and the drain. Annealing the semiconductor device includes forming a salicide layer having a germanium concentration less than 3% by weight.

19 Claims, 6 Drawing Sheets

(51) Int. Cl.
*H01L 29/417* (2006.01)
*H01L 29/49* (2006.01)
*H01L 29/66* (2006.01)
*H01L 29/78* (2006.01)
*H01L 21/02* (2006.01)

(52) U.S. Cl.
CPC ........ *H01L 29/4975* (2013.01); *H01L 29/665* (2013.01); *H01L 29/66507* (2013.01); *H01L 29/7845* (2013.01); H01L 21/0262 (2013.01); H01L 21/02631 (2013.01); H01L 21/2855 (2013.01); H01L 21/28097 (2013.01); H01L 21/28556 (2013.01); H01L 29/4933 (2013.01); H01L 29/7848 (2013.01)

(56) References Cited

U.S. PATENT DOCUMENTS

| | | |
|---|---|---|
| 2006/0105527 A1 | 5/2006 | Saito |
| 2007/0181955 A1 | 8/2007 | Chen et al. |
| 2008/0265256 A1* | 10/2008 | Lin .................. H01L 29/665 257/70 |
| 2009/0050984 A1 | 2/2009 | Balasubramanian |
| 2010/0006949 A1 | 1/2010 | Snyder et al. |
| 2010/0244107 A1 | 9/2010 | Kronholz et al. |
| 2011/0065245 A1 | 3/2011 | Chen et al. |

\* cited by examiner

SALICIDE FORMATION USING A CAP LAYER

PRIORITY CLAIM

The present application is a continuation of U.S. application Ser. No. 13/367,989, filed Feb. 7, 2012, which is incorporated herein by reference in its entirety.

BACKGROUND

Many semiconductor devices use metal-silicon compounds called silicdes to enhance conductivity between source and drain features and conductive lines. Salicides are self-aligned silicides. Self-aligned refers to a manufacturing technique where a gate electrode region of a transistor is used as a mask for doping the source and drain. Some techniques for forming salicides over source and drain features include depositing a metal layer over a surface of a semiconductor assembly including the source and drain features. The assembly is then annealed to form a salicide in a reaction between silicon atoms in the source and drain features and metal atoms in the metal layer. The unreacted metal is then removed using an etching process.

The reaction to form salicide consumes silicon atoms in the source and drain features. If the source and drain features have an insufficient amount of silicon at a surface interface with the metal layer, in some instances, the salicide is also etched through during the etching process to remove unreacted metal. Etching through the salicide creates openings that can form short circuits when metal contacts are deposited on the source and drain features. Additionally, in situations where silicon atoms are unevenly concentrated in the source and drain features, voids can form in the salicide and cause the semiconductor device to malfunction.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are of course, merely examples and are not intended to be limiting.

Figure 1:
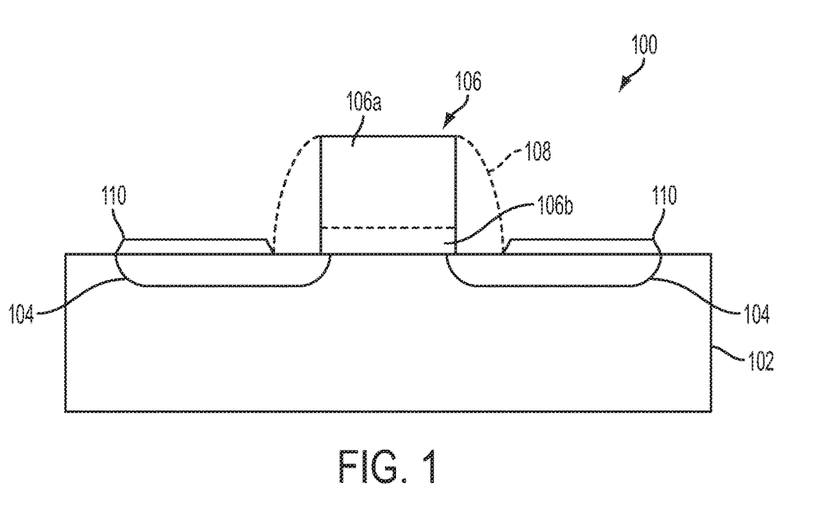
FIG. 1 is a side view diagram of a semiconductor device including cap layers, according to one ore more embodiments.

FIG. 1 is a side view diagram of a semiconductor device 100 according to an embodiment. Semiconductor device 100 includes a substrate 102 having source and drain features 104 in substrate 102. Semiconductor device 100 includes a gate stack 106 and optional spacers 108 over substrate 102. Semiconductor device 100 further includes cap layers 110 over at least a portion of source and drain features 104.

In some embodiments, substrate 102 is silicon. In some embodiments, substrate 102 is silicon germanium, gallium arsenide, germanium or other suitable semiconductor material. In some embodiments, substrate 102 is a semiconductor on insulator such as silicon on insulator Source and drain features 104 are areas of higher charge mobility within substrate 102. In some embodiments, source and drain features 104 have higher hole mobility than substrate 102. In some embodiments, source and drain features 104 have higher electron mobility than substrate 102. In some embodiments, source and drain features 104 are doped with p-type dopants, such as boron or $BF_2$; or n-type dopants, such as phosphorous or arsenic. In some embodiments, source and drain features 104 comprise silicon germanium. In some embodiments, source and drain features 104 are substantially silicon free.

Gate stack 106 includes a gate electrode 106a over an optional a gate dielectric 106b. In some embodiments, gate electrode 106a comprises polysilicon. In some embodiments, gate electrode 106a comprises molybdenum, aluminum, copper or other suitable conductive material. In some embodiments, optional gate dielectric 106b comprises silicon dioxide. In some embodiments, optional gate dielectric 106b comprises a high k dielectric, such as hafnium silicate, zirconium silicate, hafnium dioxide, zirconium dioxide, or other suitable dielectric material.

In some embodiments, source and drain features 104 and gate stack 106 collectively form a transistor. In some embodiments, where source and drain features 104 are selected to enhance hole mobility, source and drain features 104 and gate stack 106 collectively form a p-type metal oxide semiconductor (PMOS) transistor. In some embodiments, where source and drain features 104 are selected to enhance electron mobility, source and drain features 104 and gate stack 106 collectively form an n-type metal oxide semiconductor (NMOS) transistor.

In some embodiments, semiconductor device 100 optionally includes spacers 108 along sidewalls of gate stack 106. In some embodiments, spacers 108 comprise silicon dioxide, silicon nitride, silicon oxynitride or other suitable material. In some embodiments, spacers 108 comprise non-conductive material.

Cap layers 110 are over source and drain features 104 extending beyond gate stack 106 and optional spacers 108. In at least some embodiments, cap layers 110 extend over substantially all of source and drain features 104 extending beyond gate stack 106 and optional spacers 108. Cap layers 110 comprise silicon. In some embodiments, cap layers 110 have a thickness ranging from about 5 Angstroms to about 10 Angstroms. This range, in some embodiments, is narrower, e.g., from 5 Angstroms to 10 Angstroms.

In the reaction to form a salicide layer (FIG. 3G) over source and drain features 104, silicon is consumed. In some embodiments, where source and drain features 104 do not comprise sufficient silicon concentrations, the salicide layer formed over source and drain features 104 is insufficiently thick to prevent etching through the salicide layer and prevent exposing source and drain features 104 during removal of unreacted metal. Exposing source and drain features 104 creates short circuits when metallized features, e.g., vias, are formed in contact with source and drain features 104. Cap layers 110 provide sufficient silicon atoms to form the salicide layer over source and drain features 104 to a thickness sufficient to avoid etching through the salicide layer. The inclusion of cap layers 110 in semiconductor device 100, thus acts to increase the yield of a production process by reducing the number of semiconductor devices that are defective due to short circuits.

Cap layers 110 also provide substantially uniform silicon concentration over source and drain features 104. In some instances where the salicide layer is formed with variations in silicon concentration, voids form in the salicide layer thereby increasing resistance to current flow. Increased resistance causes semiconductor device 100 to perform below acceptable standards. Cap layers 110 avoid the formation of voids in the salicide through the substantially uniform distribution of silicon, thereby increasing production yield.

Figure 2:
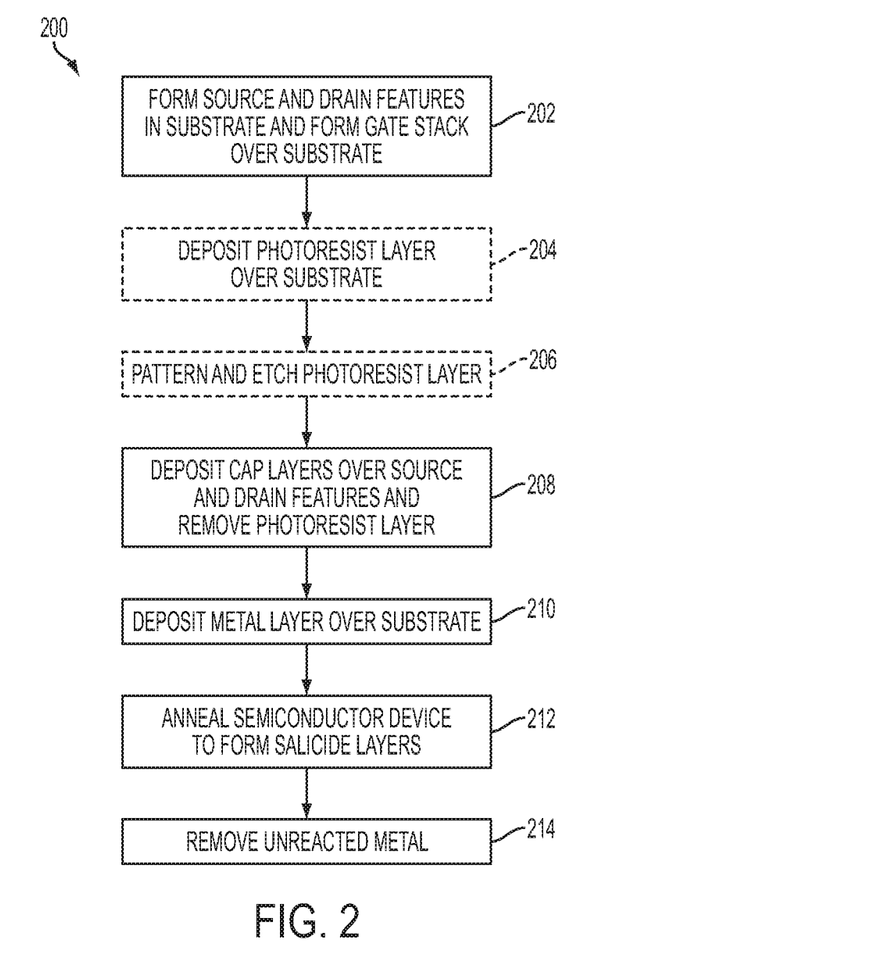
FIG. 2 is a flowchart of a method of forming a salicide layer in a semiconductor device including cap layers, according to one or more embodiment.
Figure 3A:
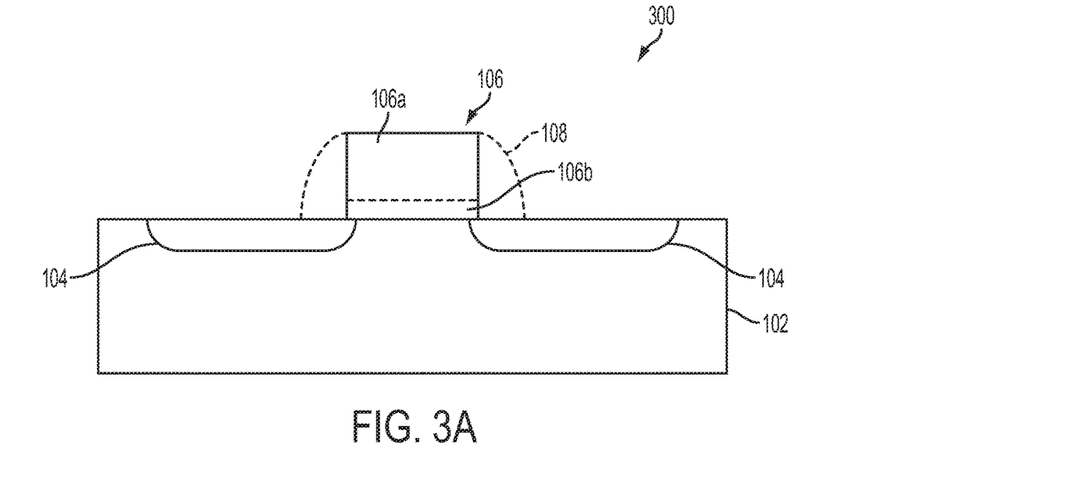
FIGS. 3A-3G are side view diagrams of a semiconductor device during various stages of the method of FIG. 2.

FIG. 2 is a process flow diagram of a method 200 of forming a semiconductor device 300, according to one or more embodiments. Method 200 begins with forming source and drain features 104 in substrate 102, gate stack 106 and optionally spacers 108 over substrate 102 in operation 202. In some embodiments, source and drain features 104 are formed by ion implantation, including tilted ion implantation. In some embodiments, source and drain features 104 are formed by doping, annealing or other suitable processes. Gate stack 106 and optional spacers 108 are formed using methods known in the art including gate last processes. FIG. 3A is a side view diagram of semiconductor device 300 following formation of source and drain features 104, gate stack 106 and optionally spacers 108.

Figure 3B:
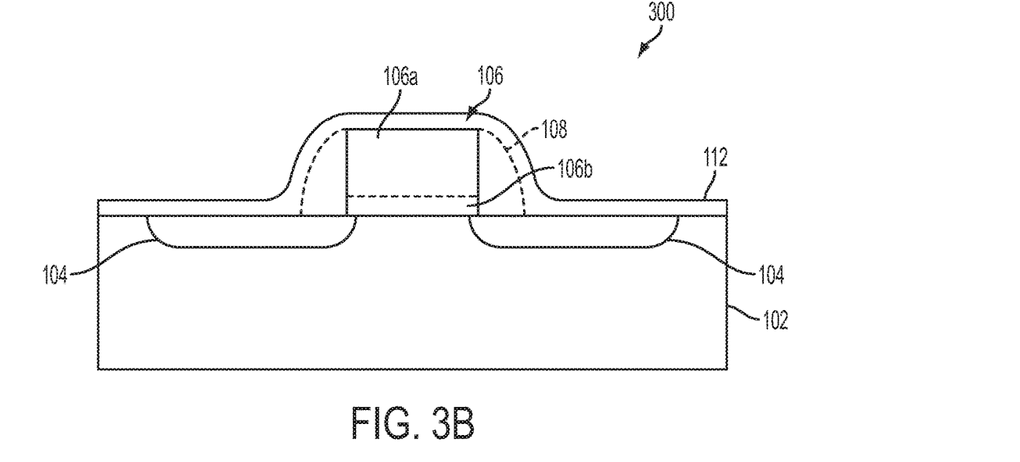

Method 200 continues with optional operation 204, in which a photoresist layer 112 (FIG. 3B) is deposited over substrate 102. In some embodiments, outer boundaries of source and drain features 104 are defined by isolation features, another gate stack, or other features over substrate 102 of semiconductor device 300. If the outer boundaries of source and drain features 104 are defined by another feature, photoresist layer 112 is eliminated, according to some embodiments. In some embodiments, spin-on deposition, physical vapor deposition, or other suitable deposition process deposits photoresist layer 112 over substrate 102.

Figure 3C:
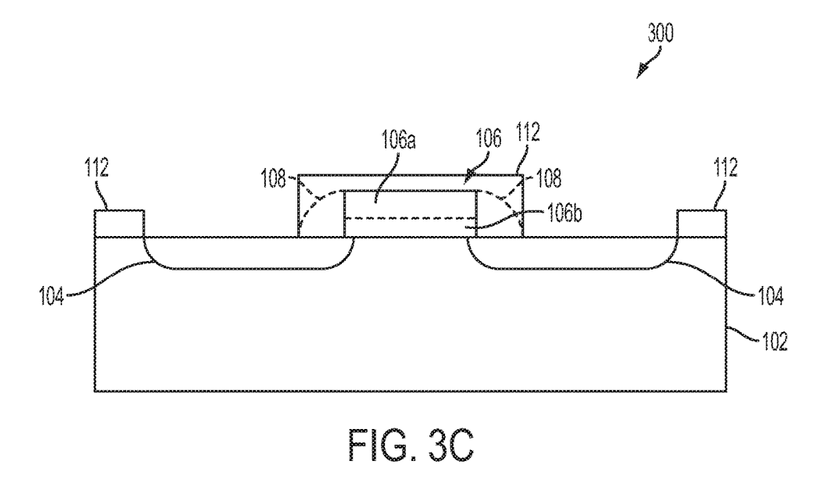

Method 200 continues with optional operation 206, in which photoresist layer 112 is patterned and etched. In some embodiments, if the outer boundaries of source and drain features 104 are defined by other features photoresist layer 112 is eliminated. If operation 204 is not used, operation 206 is likewise omitted. In some embodiments, ultraviolet light passing through a mask patterns photoresist layer 112. In some embodiments, thermal energy or other suitable patterning processes are used to pattern photoresist layer 112. In some embodiments, patterned photoresist layer 112 is etched using a wet etching process. In other embodiments, the etching process is a dry etching process, a plasma etching process, a reactive ion etching process, or other suitable etching process. FIG. 3C is a side view diagram of semiconductor device 300 following patterning and etching of photoresist layer 112.

Figure 3D:
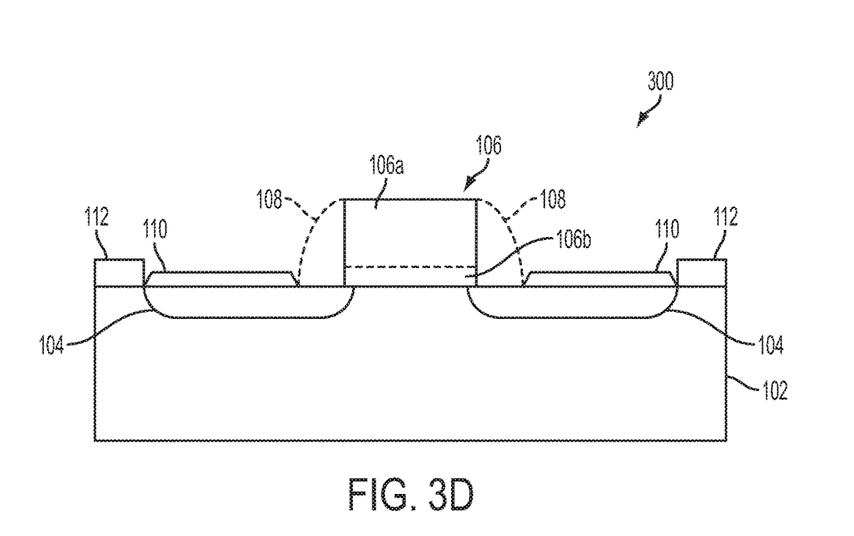

In operation 208 of method 200, cap layers 110 are deposited over source and drain features 104. In some embodiments, cap layers 110 are deposited using an epitaxial growth process. In some embodiments, cap layers 110 are deposited by sputtering, atomic layer deposition, or other suitable deposition processes. In some embodiments, deposition continues until cap layers 110 have a thickness ranging from about 5 Angstroms to about 10 Angstroms. FIG. 3D is a side view diagram of semiconductor device 300 following deposition of cap layers 110.

Following deposition of cap layers 110, optional photoresist layer 112 is removed. In some embodiments, photoresist layer 112 is removed using plasma ashing. In some embodiments, photoresist layer 112 is removed using etching or other suitable removal processes.

Figure 3E:
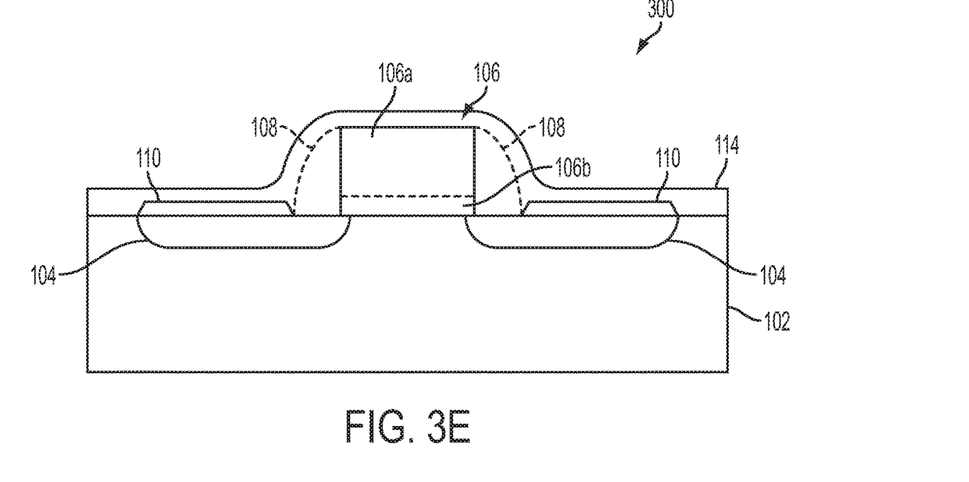

In operation 210, a metal layer 114 (FIG. 3E) is deposited over substrate 102. In some embodiments, metal layer 114 is deposited using physical vapor deposition. In some embodiments, metal layer 114 is deposited using chemical vapor deposition, atomic layer deposition, electron beam evaporation, sputtering, or other suitable deposition process. In some embodiments, metal layer 114 comprises nickel, cobalt, titanium, platinum, or other suitable metal material. In some embodiments, the deposition process continues until metal layer 114 has a thickness ranging from about 200 Angstroms to about 400 Angstroms. This range, in some embodiments, is narrower, e.g., from 200 Angstroms to 400 Angstroms. FIG. 3E is a side view diagram of semiconductor device 300 following deposition of metal layer 114.

Method 200 continues with operation 212, in which semiconductor device 300 is heated during an annealing process. The annealing process causes metal atoms in metal layer 114 to react with silicon atoms in cap layers 110 and in source and drain features 104 to create the salicide layer. In some embodiments, during the annealing process semiconductor device 300 is heated to a temperature ranging from about 200 C to about 800 C. This range, in some embodiments, is narrower, e.g., from 200 C to 800 C. In some embodiments, the annealing process continues for a duration ranging from about 1 minute to about 10 minutes.

In some embodiments, the annealing process tunes the resistivity of the salicide layer. Generally, the higher the annealing temperature and the longer the annealing duration, the lower the resistivity of the resulting salicide layer because of the formation of larger grains in the salicide layer. If the metal of metal layer 114 and the silicon of cap layers 110 react to form different compounds, tailoring the annealing process allows selective formation of a desired salicide compound. For example, when the metal of metal layer 114 is nickel, the desired salicide compound is NiSi, instead of materials with a higher resistivity such as $Ni_2Si$ or $NiSi_2$. In order to obtain the highest concentration of NiSi in the salicide layer, the annealing process takes place at a temperature of about 200 C to about 500 C for a duration of about one minute.

Figure 3F:
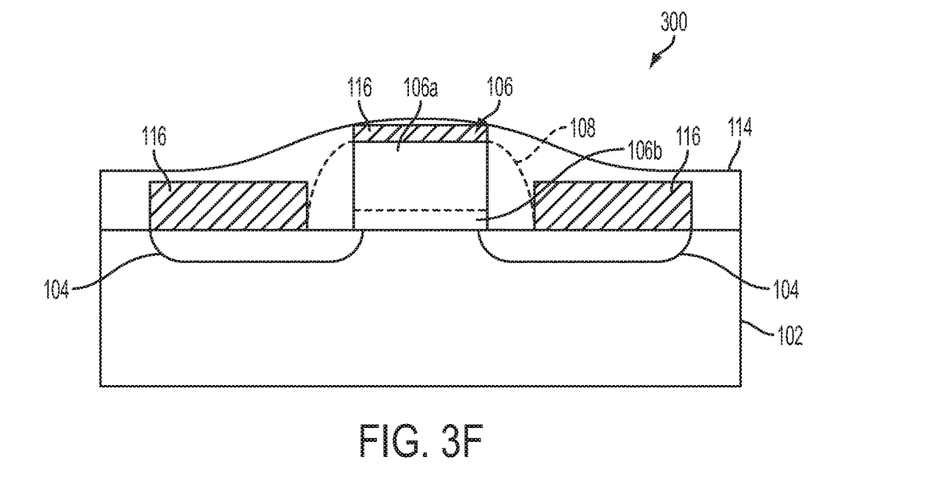

FIG. 3F is a side view diagram of semiconductor device 300 following the annealing process. The annealing process causes metal layer 114 to react with silicon to form salicide layer 116. In some embodiments, salicide layer 116 has a thickness ranging from about 120 Angstroms to about 300 Angstroms. This range, in some embodiments, is narrower, e.g., from 120 Angstroms to 300 Angstroms. In some embodiments, gate electrode 106a contains silicon, e.g., polysilicon, and the annealing process causes metal layer 114 to react with silicon atoms of gate electrode 106a to form a salicide layer over gate stack 106 as well as over source and drain features 104.

Figure 3G:
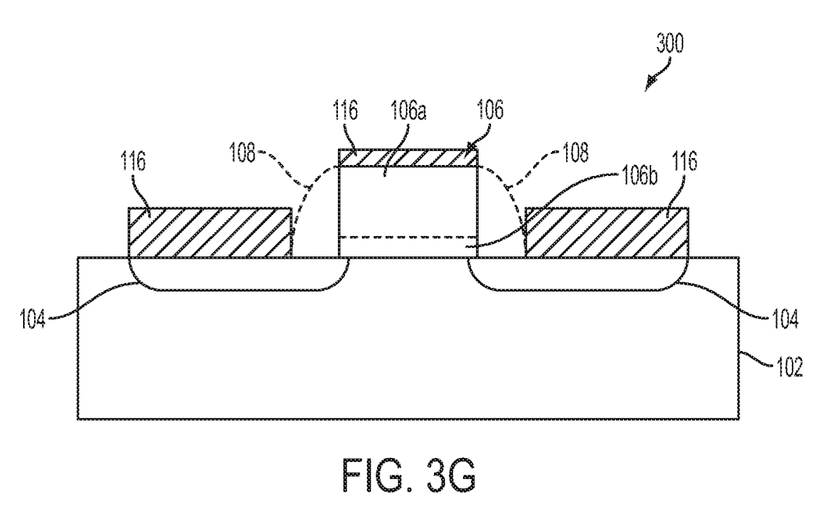

If the temperature of semiconductor device 300 is lowered below a temperature needed for metal layer 114 to react with silicon, the salicide forming reaction ceases, but unreacted metal remains in metal layer 114. In operation 214, unreacted metal in metal layer 114 is removed. In some embodiments, the unreacted metal is removed using an etching process such as wet etching, dry etching, reactive ion etching, plasma etching, or another suitable etching process. FIG. 3G is a side view diagram of semiconductor device 300 following removal of the unreacted metal.

The inclusion of cap layers 110 helps to form salicide layers 116 with sufficient thickness, to prevent the process removing metal layer 114 in operation 214 from also exposing source and drain features 104 through portions of salicide layers 116. In some embodiments where the source and drain features 104 include silicon germanium, the inclusion of cap layers 110 also aids in forming salicide layers 116 having reduced amounts of germanium within the salicide layers. In some embodiments, a germanium concentration within salicide layers 116 is less than about 3% by weight. Using conventional techniques which do not include cap layers 110, a germanium concentration within conventional salicide layers ranges from about 13% by weight to about 17% by weight.

Following formation of salicide layers 116, electrical contacts are connected to salicide layers 116 and electrically connected to an interconnect structure to incorporate semiconductor device 300 into a circuit. Including cap layers 110 in the formation of semiconductor device 300 increases production yield over formation processes in which cap layers 110 are omitted.

One aspect of this description relates to a method of forming a semiconductor device. The method includes forming a source feature and a drain feature in a substrate. The method further includes forming a gate stack over a first portion of the source feature and a first portion of the drain feature, the gate stack comprising a gate electrode. The method further includes depositing a first cap layer comprising silicon over a second portion of the source feature exposed by the gate stack. The method further includes depositing a second cap layer comprising silicon over a second portion of the drain feature exposed by the gate stack. The method further includes depositing a metal layer over the gate stack, the first cap layer and the second cap layer. The method further includes annealing the semiconductor device until all of the silicon in the first cap layer and the second cap layer reacts with metal from the metal layer, wherein the annealing causes metal from the metal layer to react with silicon in the first cap layer, the second cap layer, the source feature, and the drain feature while leaving at least a portion of the gate electrode free of silicide. Annealing the semiconductor device includes annealing the semiconductor device at a temperature ranging from 450° C. to 800° C. to form a salicide layer having a germanium concentration less than 3% by weight.

Another aspect of this description relates to a method of forming a semiconductor device. The method includes forming a source feature and a drain feature in a substrate. The method further includes forming a gate stack over a first portion of the source feature and a first portion of the drain feature, the gate stack comprising a gate electrode. The method further includes depositing, patterning, and etching a photoresist layer over the substrate. The method further includes depositing a first cap layer comprising silicon over a second portion of the source feature exposed by the gate stack and the photoresist layer. The method further includes depositing a second cap layer comprising silicon over a second portion of the drain feature exposed by the gate stack and the photoresist layer. The method further includes removing the photoresist layer. The method further includes depositing a metal layer over the gate stack, the first cap layer and the second cap layer. The method further includes annealing the semiconductor device until all of the silicon in the first cap layer and the second cap layer is consumed by a silicidation reaction, wherein the annealing causes metal from the metal layer to react with silicon in the first cap layer, the second cap layer, the source feature, and the drain feature while leaving at least a portion of the gate electrode free of silicide. Annealing the semiconductor device includes annealing the semiconductor device at a temperature ranging from 450° C. to 800° C. to form a silicide layer having a germanium concentration less than 3% by weight.

Still another aspect of this description relates to a semiconductor device. The semiconductor device includes a substrate having a source feature and a drain feature therein configured to enhance charge mobility. The semiconductor device further includes a gate stack over a portion of the source feature and a portion of the drain feature. The semiconductor device further includes a first salicide layer over substantially the entire source feature not covered by the gate stack, wherein the first salicide layer has a germanium concentration less than about 3% by weight. The semiconductor device further includes a second salicide layer over substantially the entire drain feature not covered by the gate stack, wherein the second salicide layer has a germanium concentration less than about 3% by weight.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A method of forming a semiconductor device, the method comprising:
    forming a source feature and a drain feature in a substrate, wherein the source feature and the drain feature each comprise a germanium-containing semiconductor material;
    forming a gate stack directly over a first portion of the source feature and a first portion of the drain feature, the gate stack comprising a gate electrode;
    depositing a photoresist layer over exposed surfaces of the source feature, the drain feature, the gate stack and the substrate;
    patterning the photoresist layer to expose a second portion of the source feature and a second portion of the drain feature;
    depositing a first cap layer comprising silicon over the second portion of the source feature;
    depositing a second cap layer comprising silicon over the second portion of the drain feature;
    removing the patterned photoresist layer;
    depositing a metal layer over the gate stack, the first cap layer and the second cap layer; and
    annealing the semiconductor device until all of the silicon in the first cap layer and the second cap layer reacts with metal from the metal layer, wherein the annealing causes metal from the metal layer to react with silicon in the first cap layer, the second cap layer, the source feature, and the drain feature while leaving at least a portion of the gate electrode free of silicide,
    wherein annealing the semiconductor device comprises annealing the semiconductor device at a temperature ranging from 450° C. to 800° C. to form a salicide layer having a germanium concentration greater than 0% by weight and less than 3% by weight.

2. The method of claim 1, wherein depositing the first cap layer comprises epitaxially growing a first silicon layer over the source feature and depositing the second cap layer comprises epitaxially growing a second silicon layer over the drain feature.

3. The method of claim 1, wherein depositing the first cap layer and depositing the second cap layer comprises continuing deposition until the first cap layer and the second cap layer each have a thickness ranging from 5 Angstroms to 10 Angstroms.

4. The method of claim 1, wherein depositing the metal layer comprises depositing a layer comprising at least one of nickel, cobalt, titanium, or platinum.

5. The method of claim 1, wherein depositing the metal layer comprises continuing deposition until the metal layer has a thickness ranging from 200 Angstroms to 400 Angstroms.

6. The method of claim 5, wherein annealing the semiconductor device continues until the salicide layer has a thickness ranging from 250 Angstroms to 300 Angstroms.

7. The method of claim 5, further comprising removing an unreacted portion of the metal layer from the salicide layer.

8. The method of claim 7, wherein removing the unreacted portion of the metal layer comprises etching.

9. The method of claim 1, wherein annealing the semiconductor device continues for a duration of 1 minute to 10 minutes.

10. The method of claim 1, further comprising forming spacers along sidewalls of the gate stack, wherein:
the second portion of the source feature is an entirety of the source feature exposed by the patterned photoresist layer, the gate stack and the spacers; and
the second portion of the drain feature is an entirety of the drain feature exposed by the patterned photoresist layer, the gate stack and the spacers.

11. A method of forming a semiconductor device, the method comprising:
forming a source feature and a drain feature in a substrate, wherein the source feature and the drain feature each comprise a germanium-containing semiconductor material;
forming a gate stack directly over a first portion of the source feature and a first portion of the drain feature, the gate stack comprising a gate electrode;
depositing, patterning, and etching a photoresist layer over the substrate;
depositing a first cap layer comprising silicon over a second portion of the source feature exposed by the gate stack and the photoresist layer;
depositing a second cap layer comprising silicon over a second portion of the drain feature exposed by the gate stack and the photoresist layer;
removing the photoresist layer;
depositing a metal layer over the gate stack, the first cap layer and the second cap layer; and
annealing the semiconductor device until all of the silicon in the first cap layer and the second cap layer is consumed by a silicidation reaction, wherein the annealing causes metal from the metal layer to react with silicon in the first cap layer, the second cap layer, the source feature, and the drain feature while leaving at least a portion of the gate electrode free of silicide,
wherein annealing the semiconductor device comprises annealing the semiconductor device at a temperature ranging from 450° C. to 800° C. to form a salicide layer having a germanium concentration greater than 0% by weight and less than 3% by weight, and a uniform silicon distribution.

12. A method of forming a semiconductor device, the method comprising:
forming a source/drain feature in a substrate, wherein the source/drain feature comprises a germanium-containing semiconductor material;
forming a gate stack directly over a first portion of the source/drain feature;
patterning a photoresist layer that is deposited over the source/drain feature to expose a first portion of the source/drain feature;
depositing a cap layer comprising silicon over the first portion of the source/drain feature;
removing the patterned photoresist layer;
depositing a metal layer over the cap layer after the removing of the patterned photoresist layer; and
annealing the semiconductor device until all of the silicon in the cap layer reacts with metal from the metal layer, wherein annealing the semiconductor device comprises annealing the semiconductor device at a temperature ranging from 450 degrees C. to 800 degrees C. to form a salicide layer having a germanium concentration greater than 0% by weight and less than 3% by weight.

13. The method of claim 12, wherein depositing the metal layer comprises depositing the metal layer over a gate stack.

14. The method of claim 13, wherein annealing the semiconductor device causes a reaction between the gate stack and metal from the metal layer to form a gate salicide layer.

15. The method of claim 12, wherein depositing the cap layer comprises depositing the cap layer over an entirety of the source/drain feature exposed by a gate stack and the patterned photoresist layer.

16. The method of claim 12, wherein depositing the cap layer comprises depositing the cap layer to a thickness ranging from 5 angstroms to 10 angstroms.

17. The method of claim 12, wherein depositing the cap layer comprises depositing the cap layer over less than an entirety of the source/drain feature.

18. The method of claim 12, wherein depositing the cap layer comprises depositing the cap layer having an edge aligned with an edge of the source/drain feature.

19. The method of claim 12, further comprising removing unreacted metal of the metal layer following annealing the semiconductor device.

* * * * *